us008841637B2

United States Patent
Schellenberg et al.

(10) Patent No.: US 8,841,637 B2
(45) Date of Patent: Sep. 23, 2014

(54) METHOD FOR NANOLITHOGRAPHY

(71) Applicants: Franklin Mark Schellenberg, Palo Alto, CA (US); Keith Edward Bennett, Palo Alto, CA (US)

(72) Inventors: Franklin Mark Schellenberg, Palo Alto, CA (US); Keith Edward Bennett, Palo Alto, CA (US)

( * ) Notice: Subject to any disclaimer, the term of this patent is extended or adjusted under 35 U.S.C. 154(b) by 0 days.

(21) Appl. No.: 13/987,597

(22) Filed: Aug. 12, 2013

(65) Prior Publication Data
US 2014/0055769 A1    Feb. 27, 2014

Related U.S. Application Data

(60) Continuation of application No. 13/135,119, filed on Jun. 24, 2011, now Pat. No. 8,507,881, which is a division of application No. 12/584,578, filed on Sep. 5, 2009, now Pat. No. 7,989,783, which is a division of application No. 11/522,303, filed on Sep. 15, 2006, now Pat. No. 7,586,583.

(60) Provisional application No. 60/718,038, filed on Sep. 15, 2005.

(51) Int. Cl.
*G03F 7/20* (2006.01)

(52) U.S. Cl.
CPC ................ *G03F 7/70058* (2013.01)
USPC ............................. 250/492.2; 355/53; 355/77

(58) Field of Classification Search
USPC .................. 250/492.2; 355/53, 55, 67, 77
See application file for complete search history.

(56) References Cited

U.S. PATENT DOCUMENTS 6,560,044 B2 *   5/2003   Shinoda ........................ 359/800

* cited by examiner

*Primary Examiner* — Kiet T Nguyen
(74) *Attorney, Agent, or Firm* — Franklin Schellenberg

(57) ABSTRACT

A method of performing nanolithography is disclosed, comprising use of an optical printing head that enables a super-resolution lithographic exposures compatible with conventional optical lithographic processes. The super-resolution exposures are carried out using light transmitted through specially designed super-resolution apertures, of which the "bow-tie" and "C-aperture" are examples. These specially designed apertures create small but bright images in the near-field transmission pattern. A printing head comprising an array of these apertures is held in close proximity to the object to be exposed. A data processing system is provided to re-interpret the layout data into a modulation pattern used to drive the multiple individual channels and the multiple exposures.

18 Claims, 18 Drawing Sheets

1530 DATA DRIVEN MODULATOR
1532 MODULATOR ARRAY (MICROMIRRORS)
1570 POSITION CONTROL
1580 HEAD SUPPORTS
1595 SUPPORT STRUCTURE
1590 SUPPORT FOR DATA DRIVEN MODULATOR
1560 DATA SOURCE
1562 DATA PATH CONNECTORS
1564 ELECTRONICS TO DRIVE MODULATOR
1540 LENS SYSTEM
700 WRITER HEAD
1370 HEIGHT CONTROL

__US 8,841,637 B2__

METHOD FOR NANOLITHOGRAPHY

RELATED INVENTIONS

The present application is a continuation of U.S. patent application Ser. No. 13/135,119 filed Jun. 24, 2011 (set to issue as U.S. Pat. No. 8,507,881), which is a continuation of U.S. patent application Ser. No. 12/584,578 filed Sep. 5, 2009 (now U.S. Pat. No. 7,989,783), which is a divisional of U.S. patent application Ser. No. 11/522,303 filed Sep. 15, 2006 (now U.S. Pat. No. 7,586,583) entitled NANOLITHOGRAPHY SYSTEM, which claims the benefit of U.S. Provisional Application No. 60/718,038, filed on Sep. 15, 2005, entitled WRITING HEAD FOR NANOLITHOGRAPHY, all of which are herein incorporated by reference.

BACKGROUND OF THE INVENTION

A lithography system for the fabrication of microdevices, as illustrated in FIG. 1, generally comprises a light source 100, an illumination system 110, a reticle (sometimes called a mask or photomask) 130, a lens system 140, and a stage 145 to hold a semiconductor wafer 150. Light 102 from the source 100 is directed by the illumination system 110 onto the reticle 130, and the lens 140 collects the light from the reticle and forms an image on the wafer 150. The wafer is coated with a photosensitive material, called a photoresist, and after exposure and suitable development, the pattern of the image is converted into a pattern in the photoresist, used to control subsequent manufacturing steps.

These imaging systems, although capable of achieving resolutions as small as a quarter to a third of the wavelength used for exposure, are still limited by diffraction phenomena and the ability of the lens to collect enough light emerging from the photomask. For state-of-the-art systems, $\lambda=193$ nm, and therefore with conventional lens aperture (NA=0.93), the ultimate resolution that can be achieved is approximately $$L = 0.25 \lambda / NA = 52 \text{ nm}.$$

Optical systems capable of producing smaller features, usually through near-field or evanescent phenomena, are considered "super-resolution" patterning systems.

For the fabrication of smaller features using conventional lithographic processing techniques, a shorter wavelength must be used. Such solutions are possible, but have practical limitations. For shorter optical wavelengths, ($\lambda<185$ nm), oxygen in the air absorbs the photon energy, as does quartz, the normal lens fabrication material. Vacuum systems and reflective optics can be used, and have been demonstrated for systems using plasma induced Extreme Ultraviolet (EUV) radiation at $\lambda=13$ nm. However, no conventional light sources at 13 nm exist, and generating enough photons and fabricating masks and lenses using multilayer reflectors (which typically have 70% reflection efficiency) provides an economically unattractive solution.

Electron beams can also be used. 50 keV electrons have a $\lambda=0.001$ nm, certainly small enough to resolve small features, and electron beam imaging systems, operating again in a vacuum, have been constructed and used to fabricate features near atomic dimensions. However, unlike photons, electrons are charged, and in high enough densities, repel each other, causing image distortion. This has proven an insurmountable problem for electron projection lithography, and most electron beam systems are serial—exposing a single spot at a time with a single beam. Furthermore, with each electron accelerated to an energy of 50 keV, the dose needed to expose resist can be provided by only a few hundred electrons, making statistical shot noise a problem for exposure uniformity.

Smaller resolution is not the only problem facing contemporary IC patterning. The complex masks enabling sub-wavelength exposure can be very expensive, due to the complex processes needed to fabricate them and their generally low yield. Although ICs to be produced in large volume can absorb these costs, low volume ICs and prototypes (which are generally discarded, not sold) suffer from the costs and delays in reliably producing advanced photomasks. Such projects, which may see low or no return on the investment, would benefit from a fabrication technique which is both rapid and inexpensive.

To achieve fabrication of features smaller than 40 nm, especially when large numbers of features are desired simultaneously at dense pitches, as in a conventional IC, there is therefore a need for a direct-write, or "maskless" high resolution lithography system. The need for these is greatest for low volume and prototype applications.

Ideally, such a maskless system would be compatible with the conventional optical infrastructure currently deployed in IC fabs. Ideally, such a system could be used with throughputs comparable to conventional exposure tools. If feasible, the exposures should also be verified as they are being written, as there is no mask that can be inspected (as in "conventional" IC manufacture, to guarantee that the pattern data has been accurately transcribed.

One proposed maskless system uses parallel electron beam writers, such as the MAPPER system proposed by MAPPER Lithography of the Netherlands. This is illustrated in FIG. 2. In this system, an electron beam 202 is emitted from an electron source 200, and electron steering electronics 210 divide this beam into as many as 13,000 parallel electron beam channels. These are guided by electron lenses 220 towards the wafer 250 to be exposed. At the wafer exposure occurs by raster scanning the beams using the final beam controllers 240. En route, each beam passes through an aperture 232 in an aperture plate 230, where individual signals from blanking electronics 264 modulate the individual electron beams. These blanking electronics 264 are directed using signals passed over optical fibers 262, in turn driven directly by a data processing system 260 using the IC layout data. The layout data directing the blankers is synchronized with the wafer stage position so that exposure matches the correct dose for that particular wafer location.

This can work in principle, since the individual electron beams can provide the resolution, and the parallel channels provide the speed. In practice, this system is prone to jitter and thermal instability, and since the energy associated with each electron is so high, shot noise remains an issue. Special e-beam materials must also be used, and are not those currently used in a conventional optical lithography process, which leads to compatibility issues when inserted into a contemporary fab.

Optical maskless systems driven directly by layout data have also been proposed. Such a system is illustrated in FIG. 3. These systems are similar to conventional optical lithography systems, in that they also have light 302 emitted by a source 300, which is then shaped by an illumination system 310. The final imaging is also accomplished by a lens system 340, which forms an image of a "mask" 330 onto a wafer 350 mounted in a stage 345. However, here a conventional optical mask is replaced by a dynamic mask 330 comprising reflecting elements 332, and the light from the source is usually directed to the dynamic reflecting mask 330 using a beam-splitter 315 designed into the optical system. The reflecting system elements 332 of the dynamic mask 330 in turn comprise many individually driven MEMS devices, with individual elements driven with signals corresponding to pixels in the layout pattern. These MEMS devices can be an array of micromirrors, tilting at various angles to modulate the reflected light, or small elements that move in and out, sometimes called a piston mirror configuration, that modulates the phase of the reflected light. The settings of the individual pixels are driven by a data processing system 360 that sends signals derived from the IC layout through connectors 362 to circuitry 364 on the active mask 330, which sets the mirrors appropriately. The individual pixels of the micromirror array (typically comprising 1028×1028 micromirrors) or the piston array are usually 20× to 200× larger than the corresponding pixels on the wafer, and the lens system has components 320 that are designed to reduce the image appropriately.

A single array is typically far too small to represent the entire layout of an IC at once. Instead, the layout data must be split into tiles representing sub-sections of the layout that are passed in sequence to the array for exposure. The final image is then stitched together using multiple exposures of the pattern data onto the wafer 350, with the wafer stage 345 moving in a manner synchronized with the transmission of data to the dynamic reflecting array. A transmitting element, such as a liquid crystal light valve or array of thin film transistors can also be used to provide a similarly dynamic mask with either reflecting or transmitting pixels.

These systems have the advantage of using conventional optical or UV wavelengths, and therefore the infrastructure of optical materials and process knowledge and experience can be leveraged to make the adoption of this technology less disruptive. However, since conventional lens designs and materials are used, such systems are therefore subject to the same resolution limitations as conventional optical lithography.

There is therefore a need for an exposure system capable of writing extremely small, "super-resolution" patterns (that is, patterns with feature sizes smaller than the resolution obtainable by conventional optical lithography) that is also compatible with the process infrastructure currently in place in IC fabrication facilities.

BRIEF DESCRIPTION OF THE INVENTION

We present here a nanolithography system comprising a novel optical printing head suitable for high throughput nanolithography. This optical head enables a super-resolution lithographic exposure tool that is otherwise compatible with the optical lithographic process infrastructure. The exposing light is transmitted through specially designed super-resolution apertures, of which the "C-aperture" is one example, that create small but bright images in the near-field transmission pattern. A printing head comprising an array of these apertures is held in close proximity to the wafer to be exposed. In one embodiment, an illumination source is divided into parallel channels that illuminate each of the apertures. Each of these channels can be individually modulated to provide the appropriate exposure for the particular location on the wafer corresponding to the current position of the aperture. A data processing system is provided to re-interpret the layout data into a modulation pattern used to drive the individual channels.

LIST OF DRAWINGS

Figure 7A:
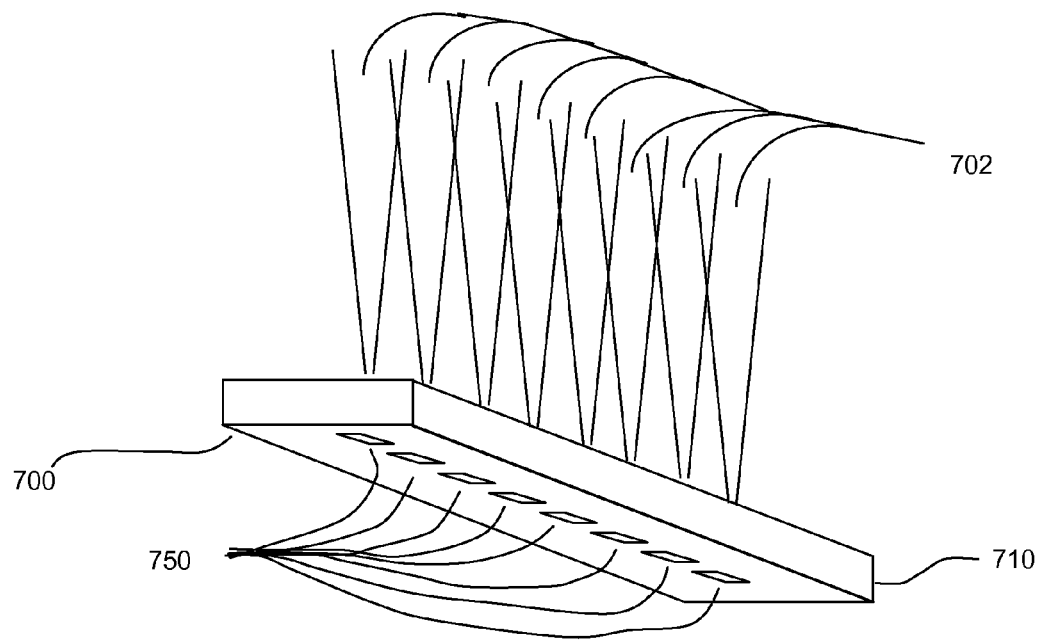

FIG. 7*a* shows a writing head with super-resolution apertures illuminated by beams of light according to the invention.

Figure 7B:
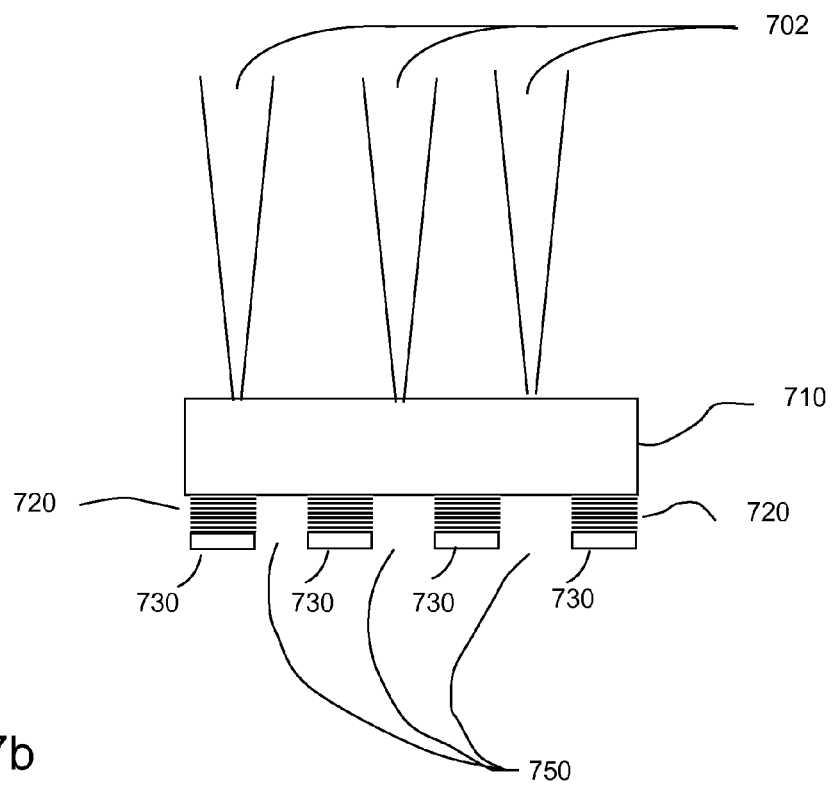

FIG. 7*b* shows a cross section of a writing head with super-resolution apertures according to the invention.

Figure 8:
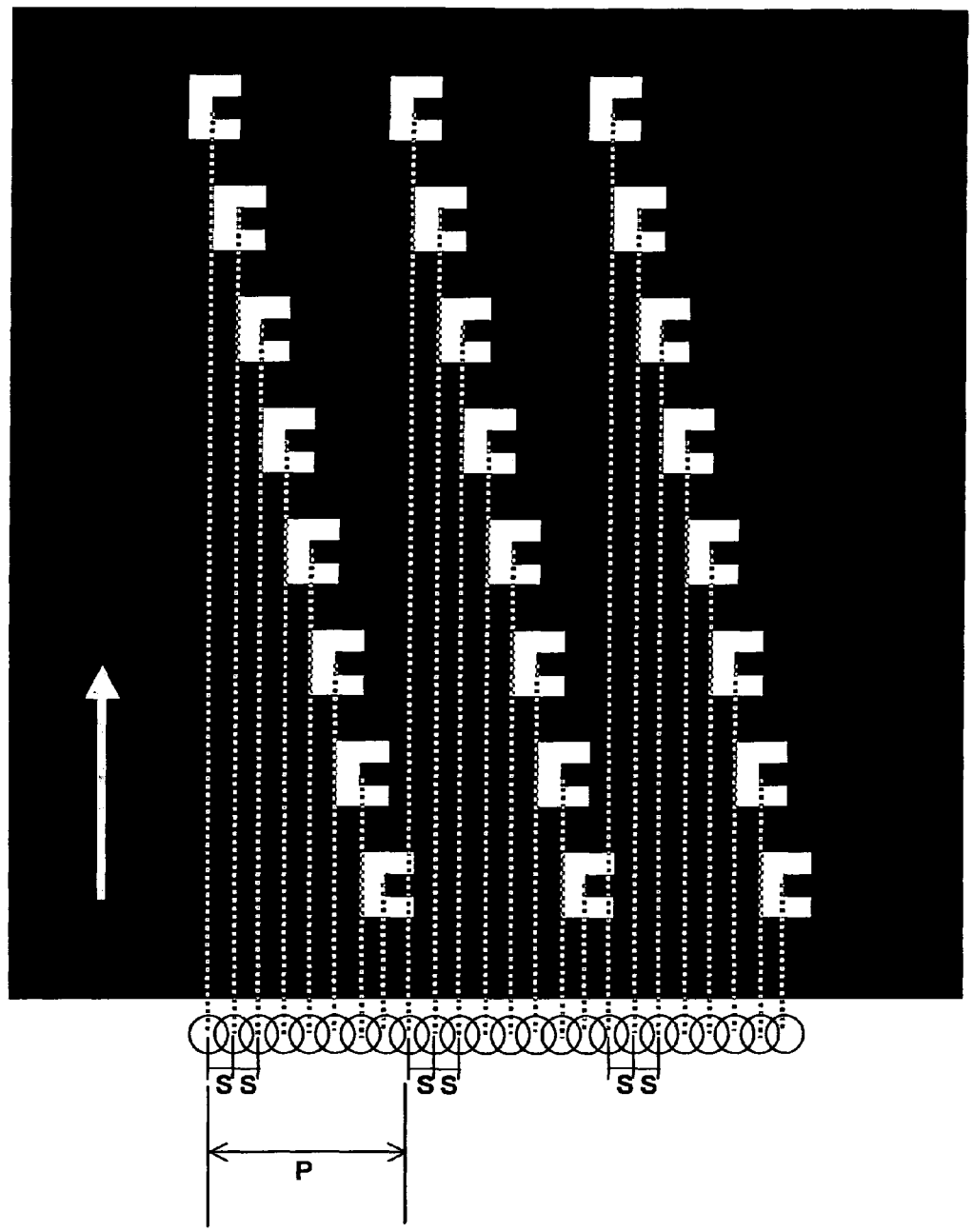

FIG. 8 shows a layout for a 2-D array of super-resolution apertures arranged to form a configuration for a nanolithography writing head, according to the invention.

Figure 9:
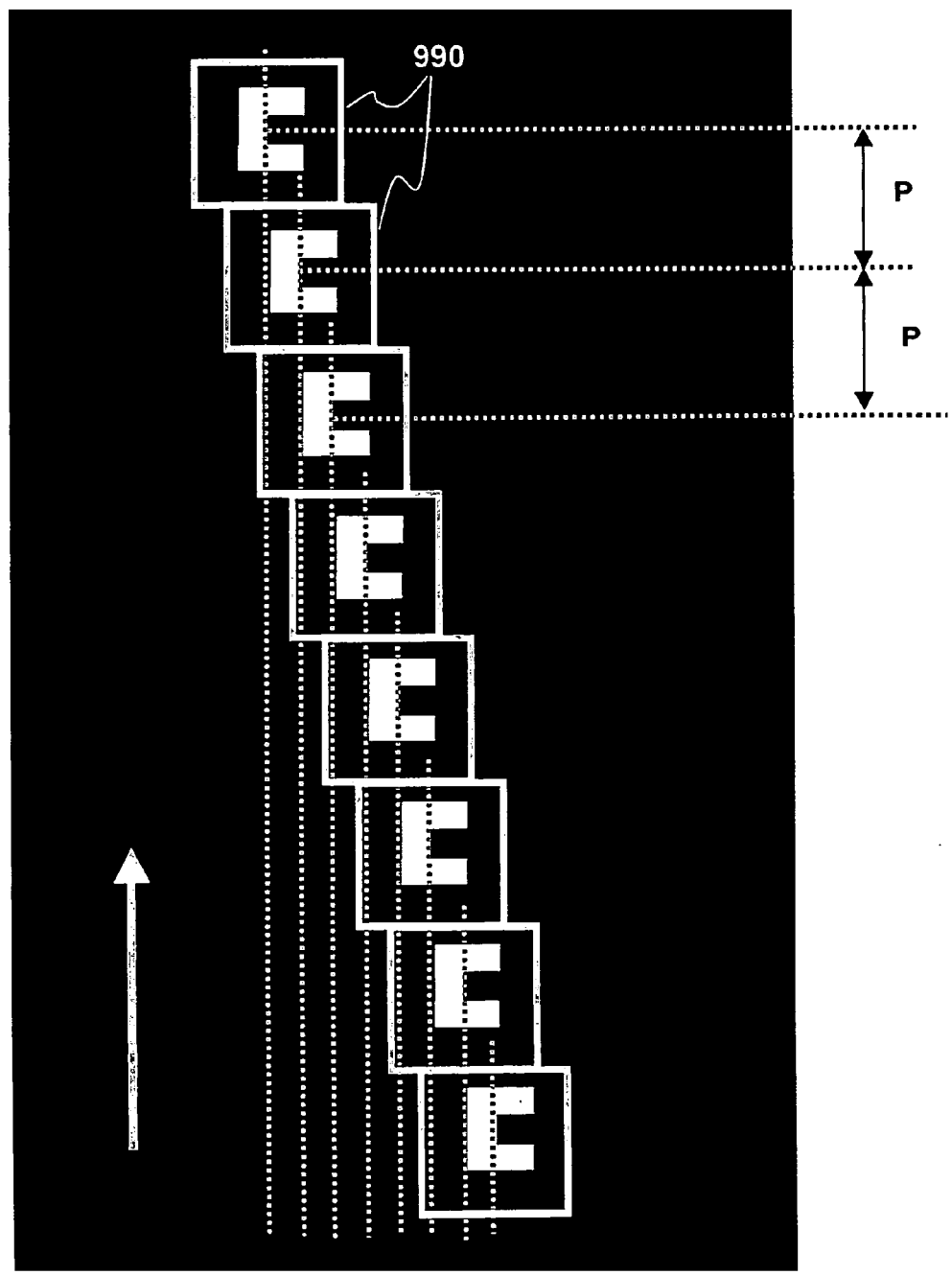

FIG. 9 shows a layout of a 1-D array of super-resolution apertures arranged to form a configuration for a nanolithography writing head with additional features to isolate individual apertures, according to the invention.

Figure 6:
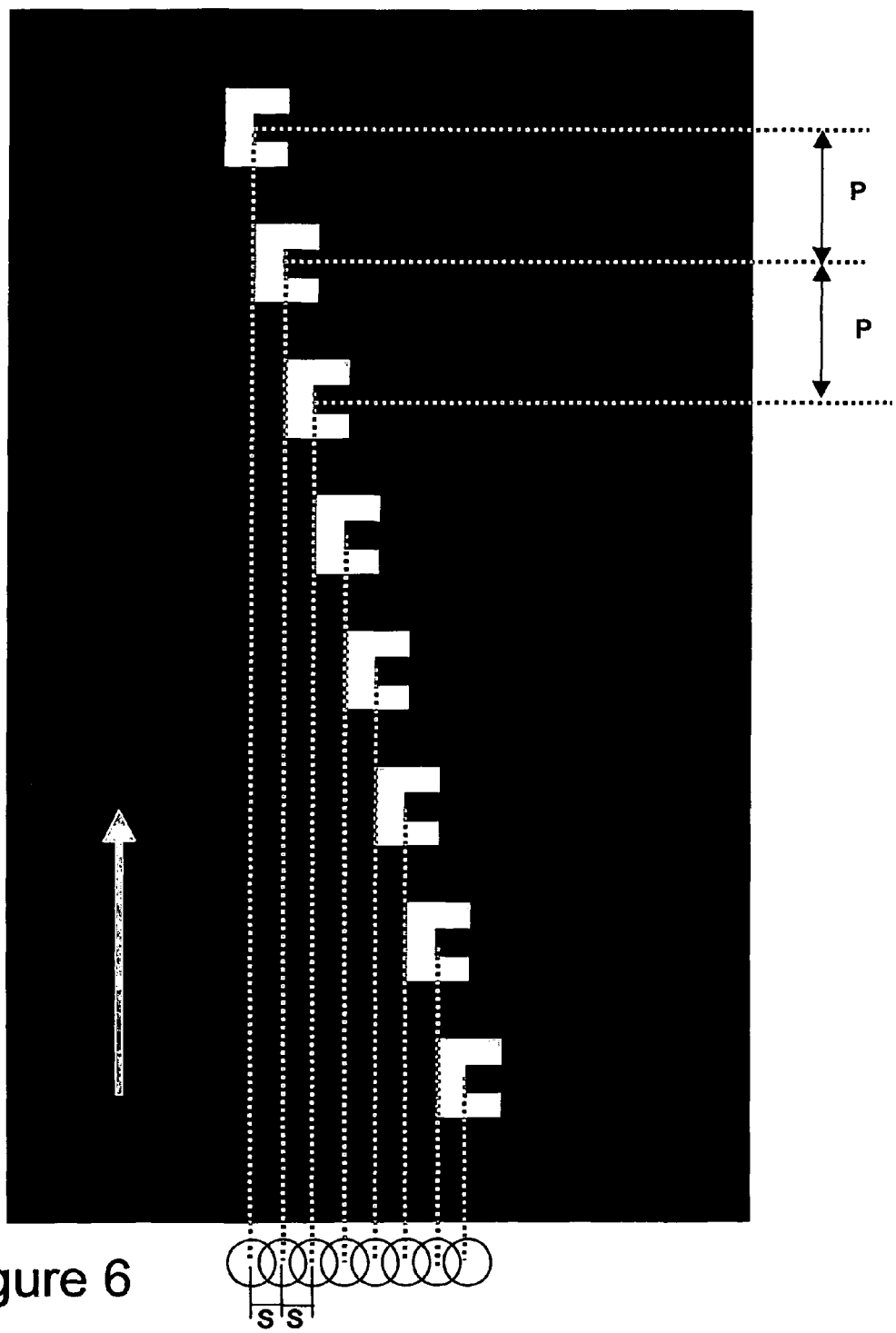
FIG. 6 shows a layout for a 1-D array of super-resolution apertures arranged to form a configuration for a nanolithography writing head, according to the invention.
Figure 10:
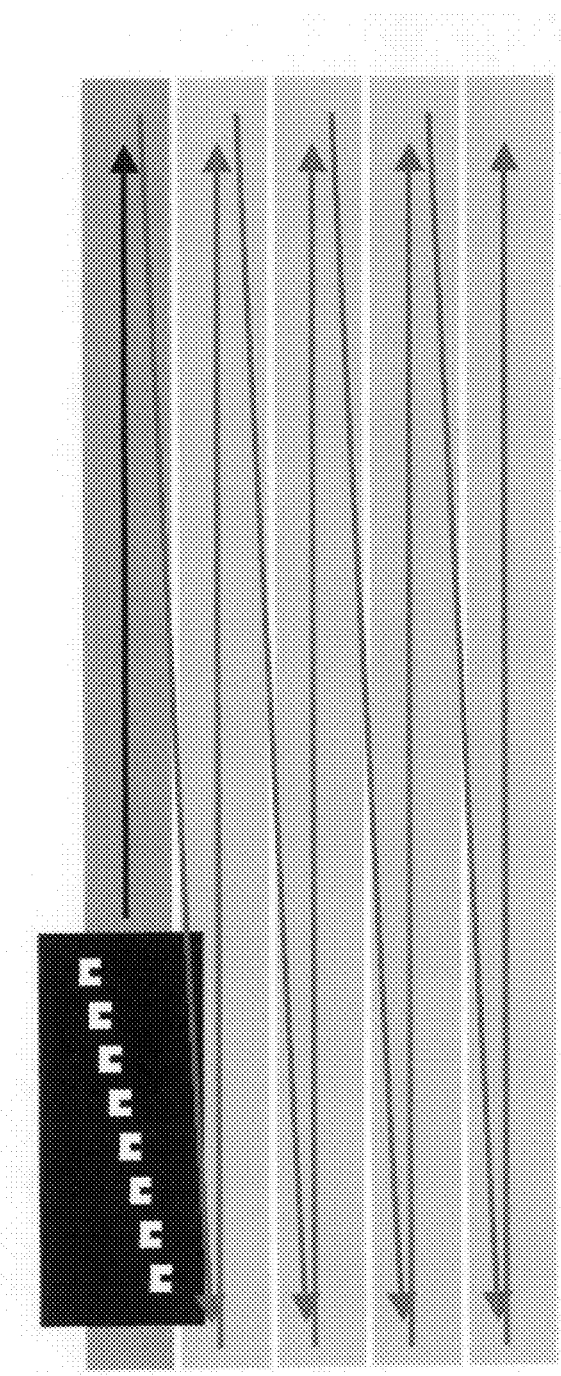

FIG. 10 shows a scanning plan for exposing a wafer using the 1-D array layout of FIG. 6, according to the invention.

Figure 11:
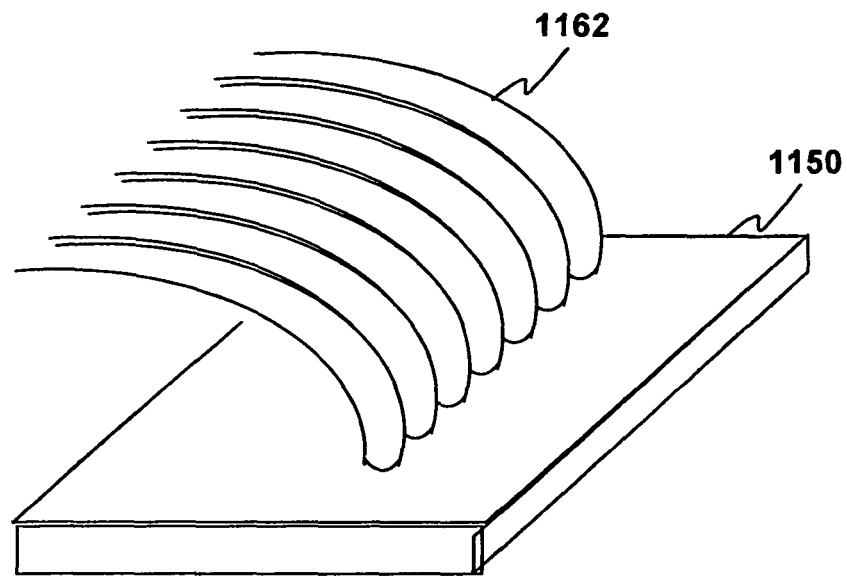

FIG. 11 shows an embodiment of the invention in which the illumination system for each of the super-resolution apertures comprises waveguides.

Figure 12:
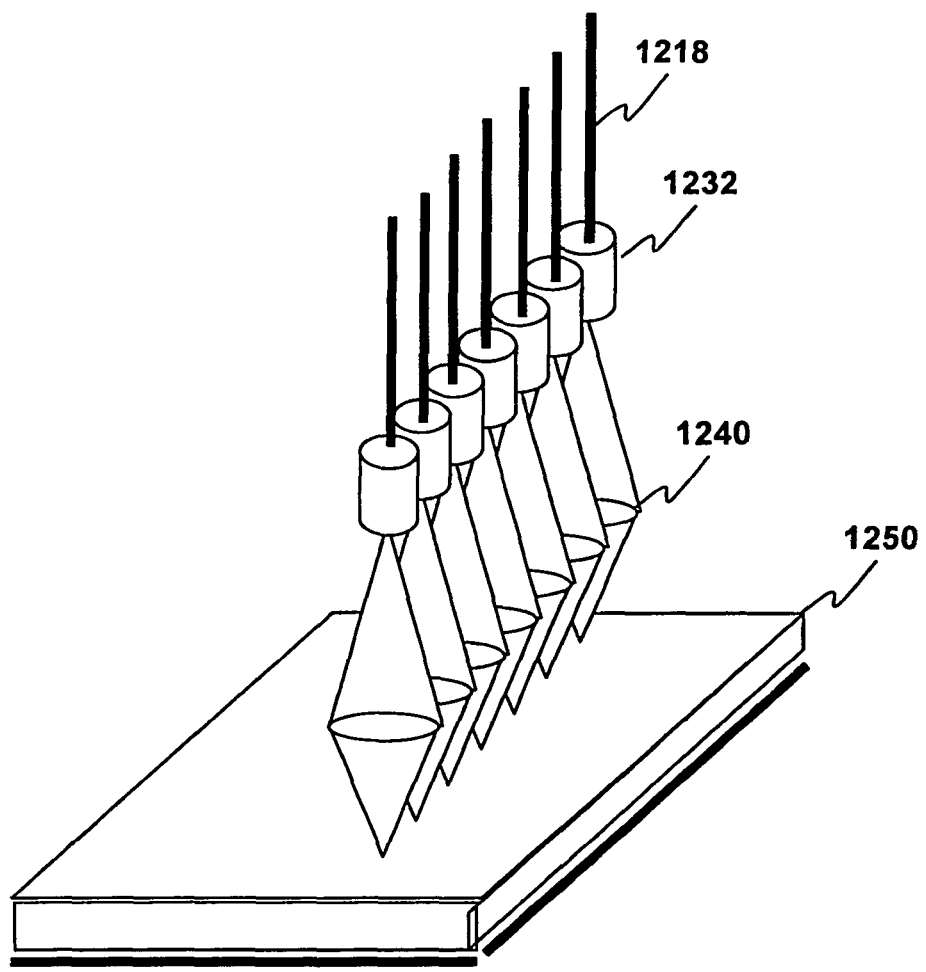

FIG. 12 shows an embodiment of the invention in which free space propagation illuminates each super-resolution aperture.

Figure 13:
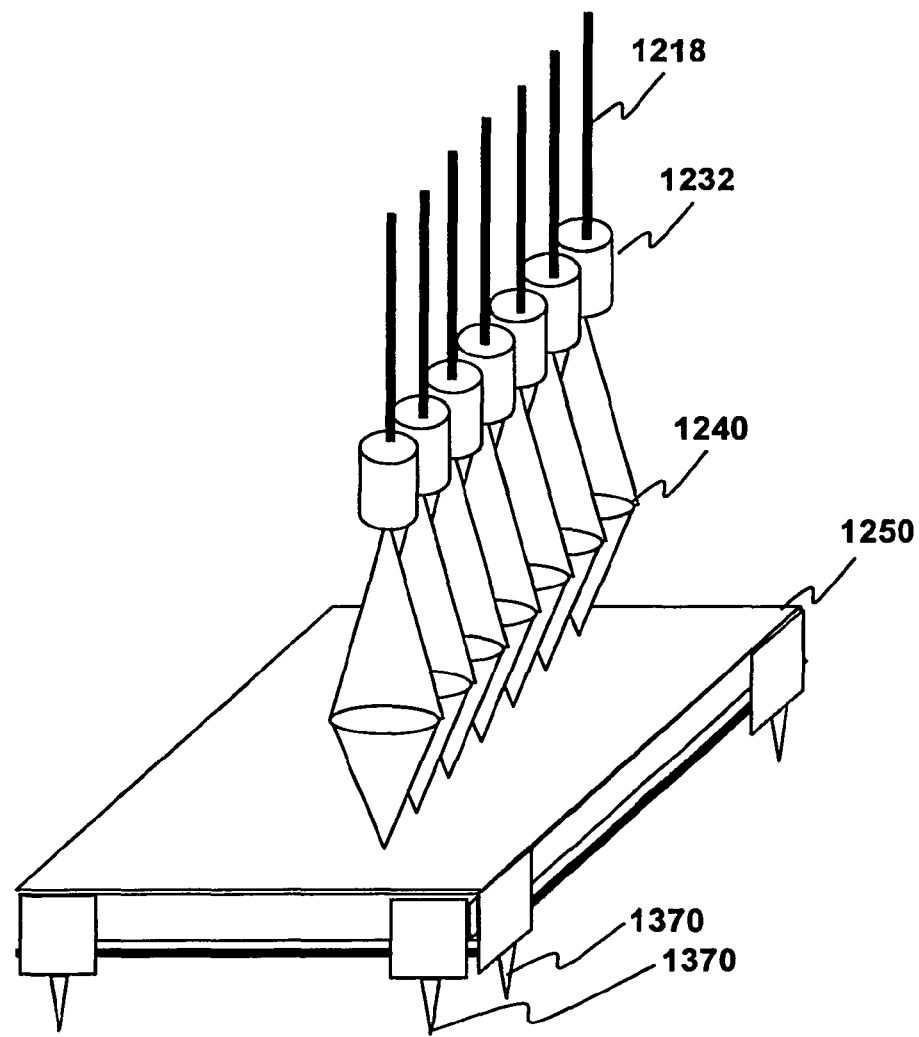

FIG. 13 shows an embodiment of the invention in which the height control for the separation of a super-resolution aperture and the material to be exposed is provided using AFM tips.

Figure 14:
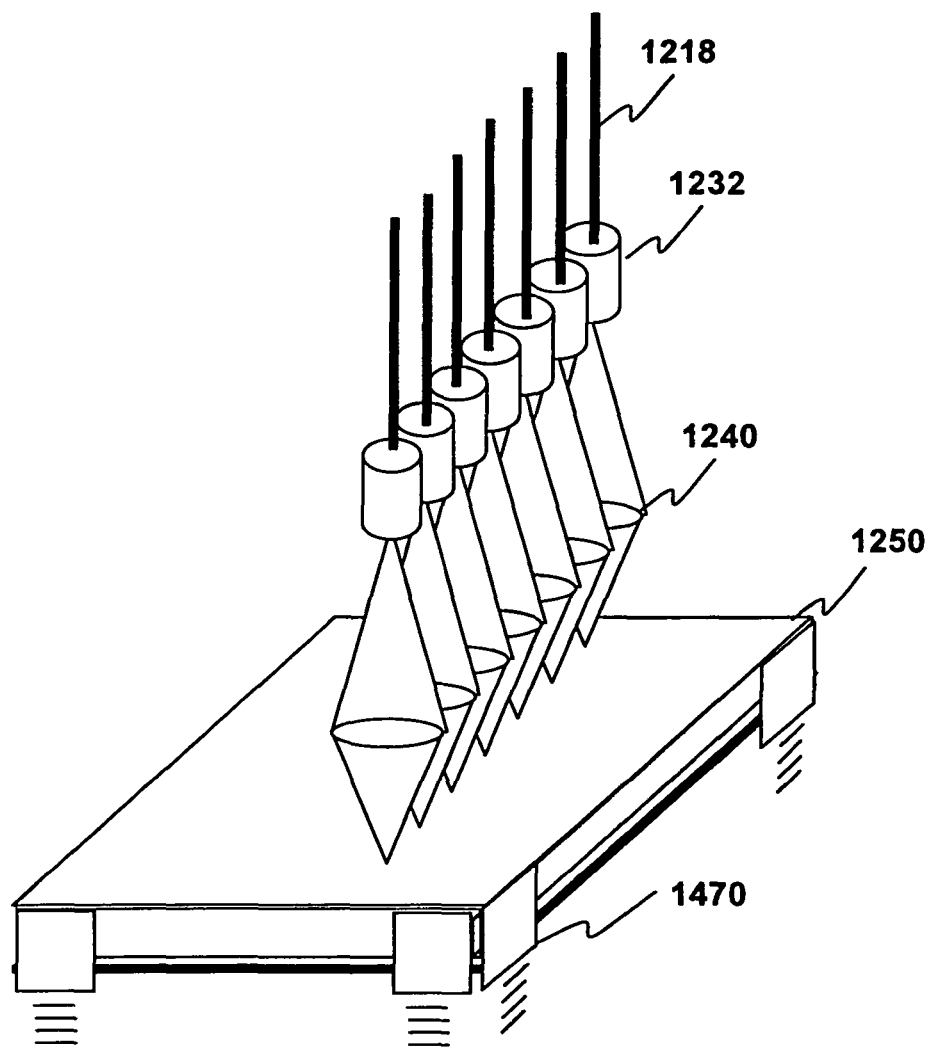

FIG. 14 shows an embodiment of the invention in which the height control for the separation of a super-resolution aperture and the material to be exposed is provided using interferometers.

Figure 15:
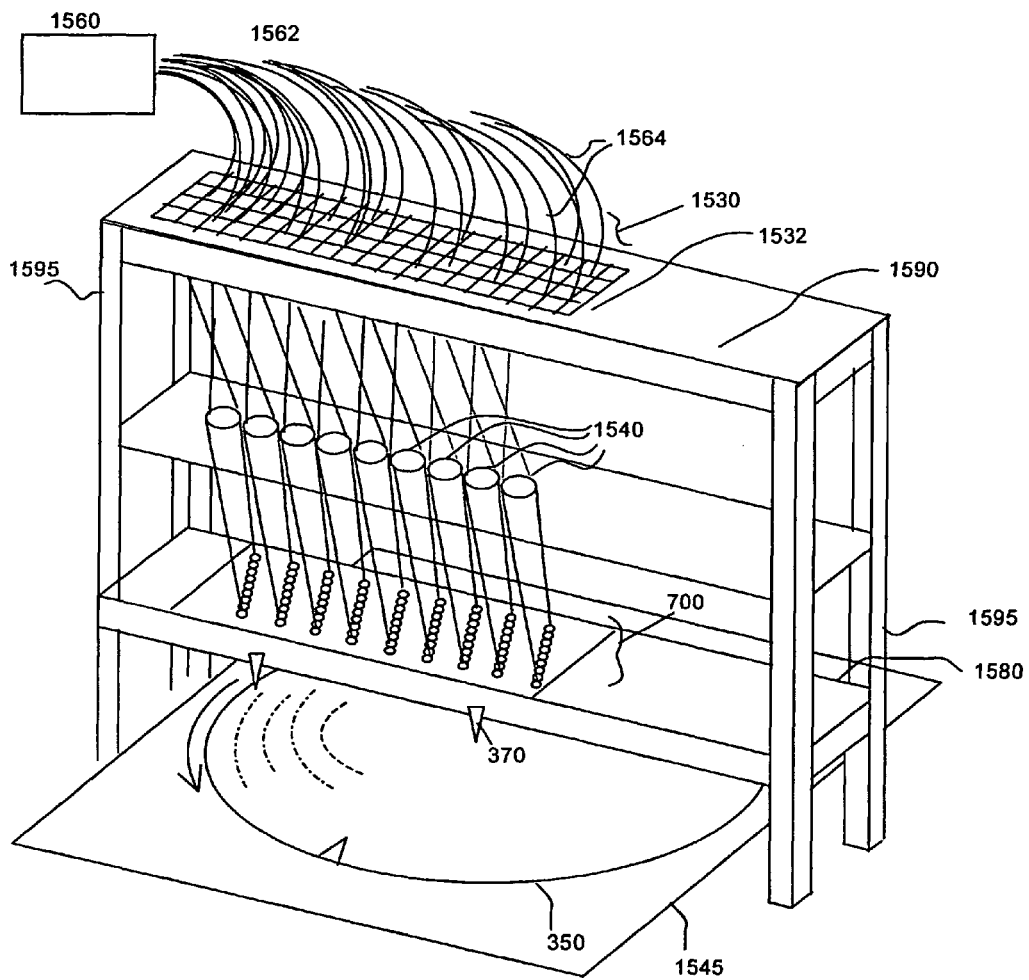

FIG. 15 shows an embodiment of the invention in which the material to be exposed rotates underneath the nanolithography writing head.

Figure 16:
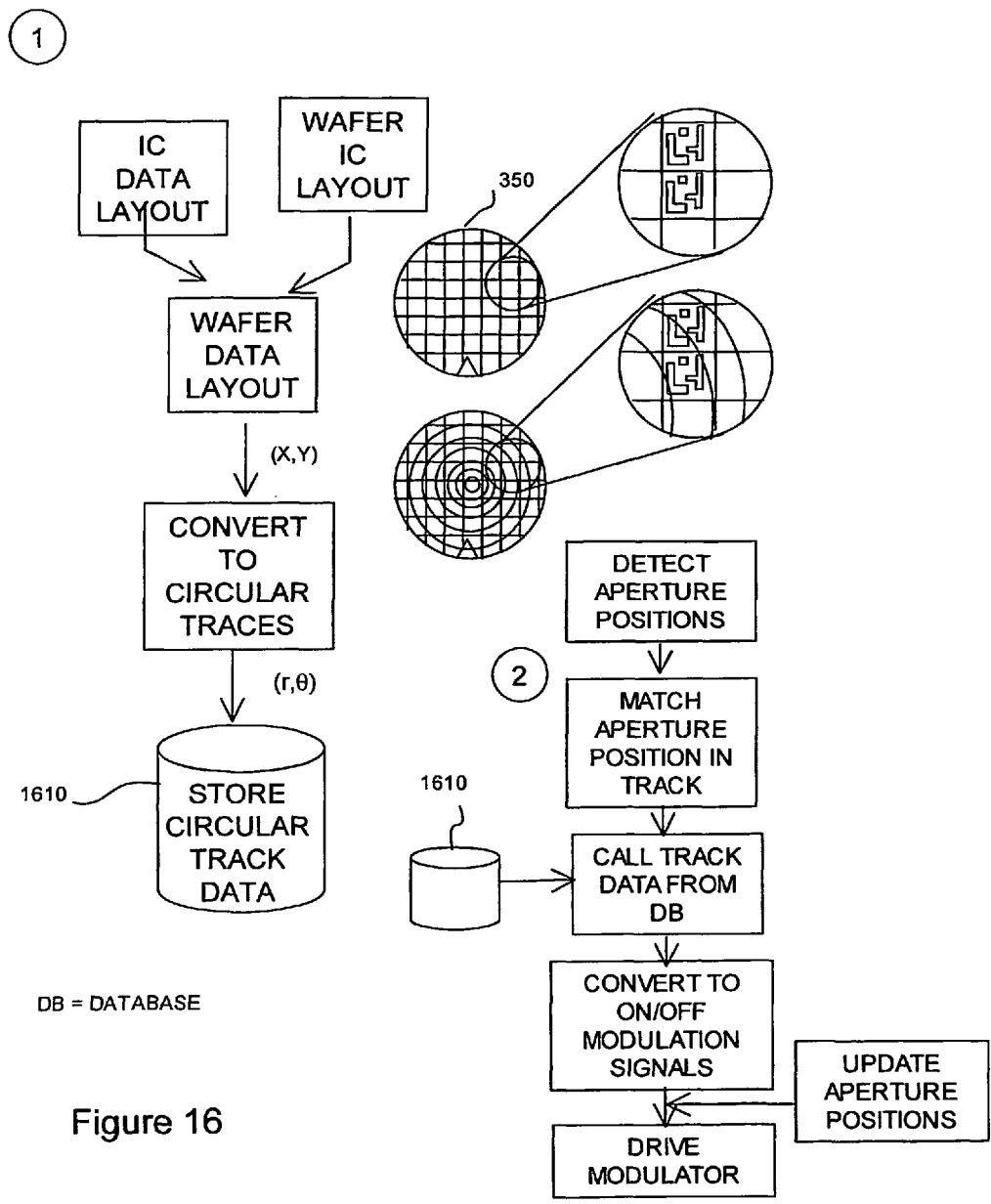

FIG. 16 shows a schematic diagram of a fracturing system according to the invention that converts conventional IC data into modulation signals for a nanolithography system in which the material to be exposed rotates beneath a writing head with super-resolution apertures.

Figure 17:
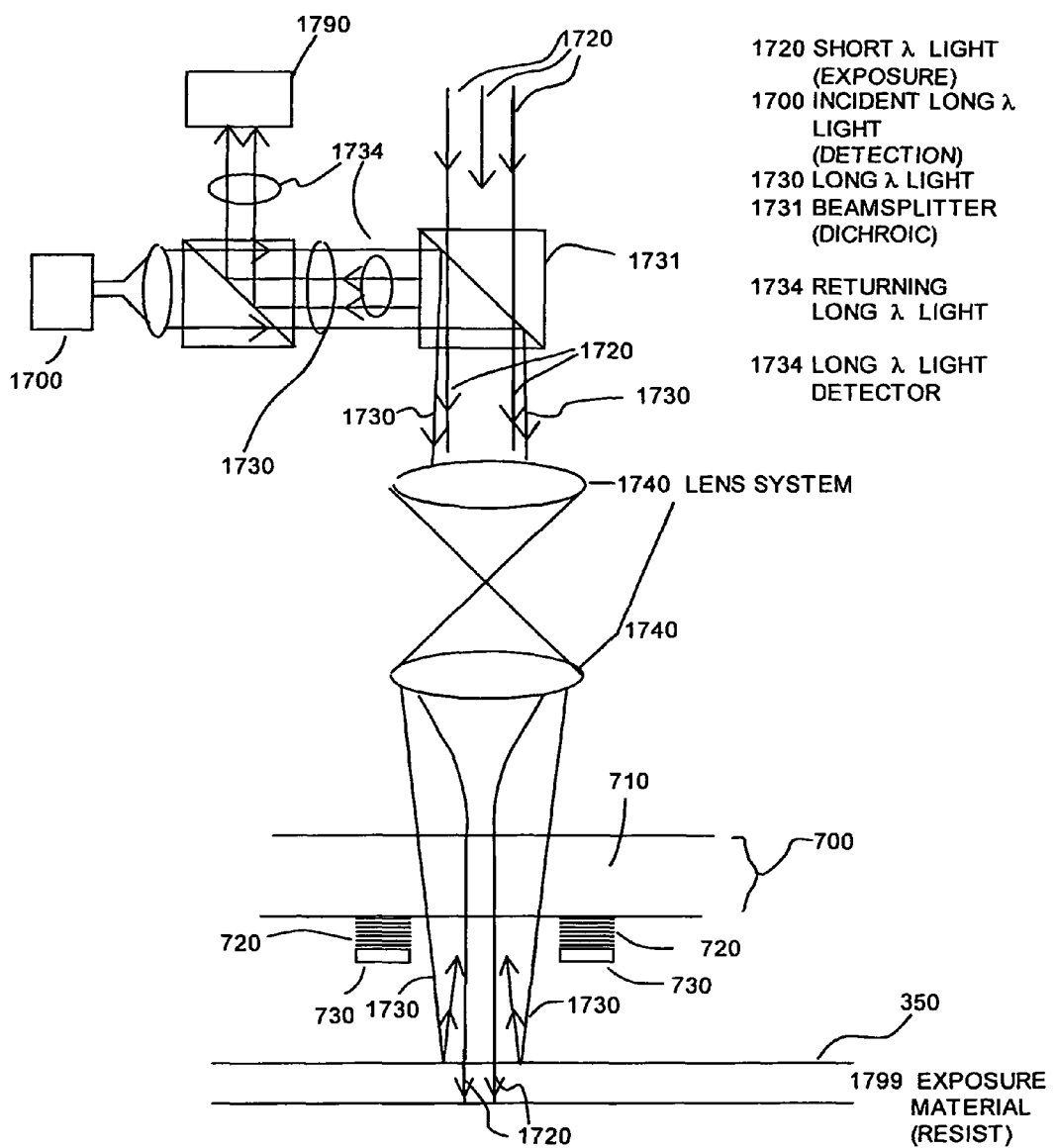

FIG. 17 illustrates an embodiment of the invention in which an additional light source having a longer wavelength is included for conducting diagnostic tests on the material during exposure.

Figure 18:
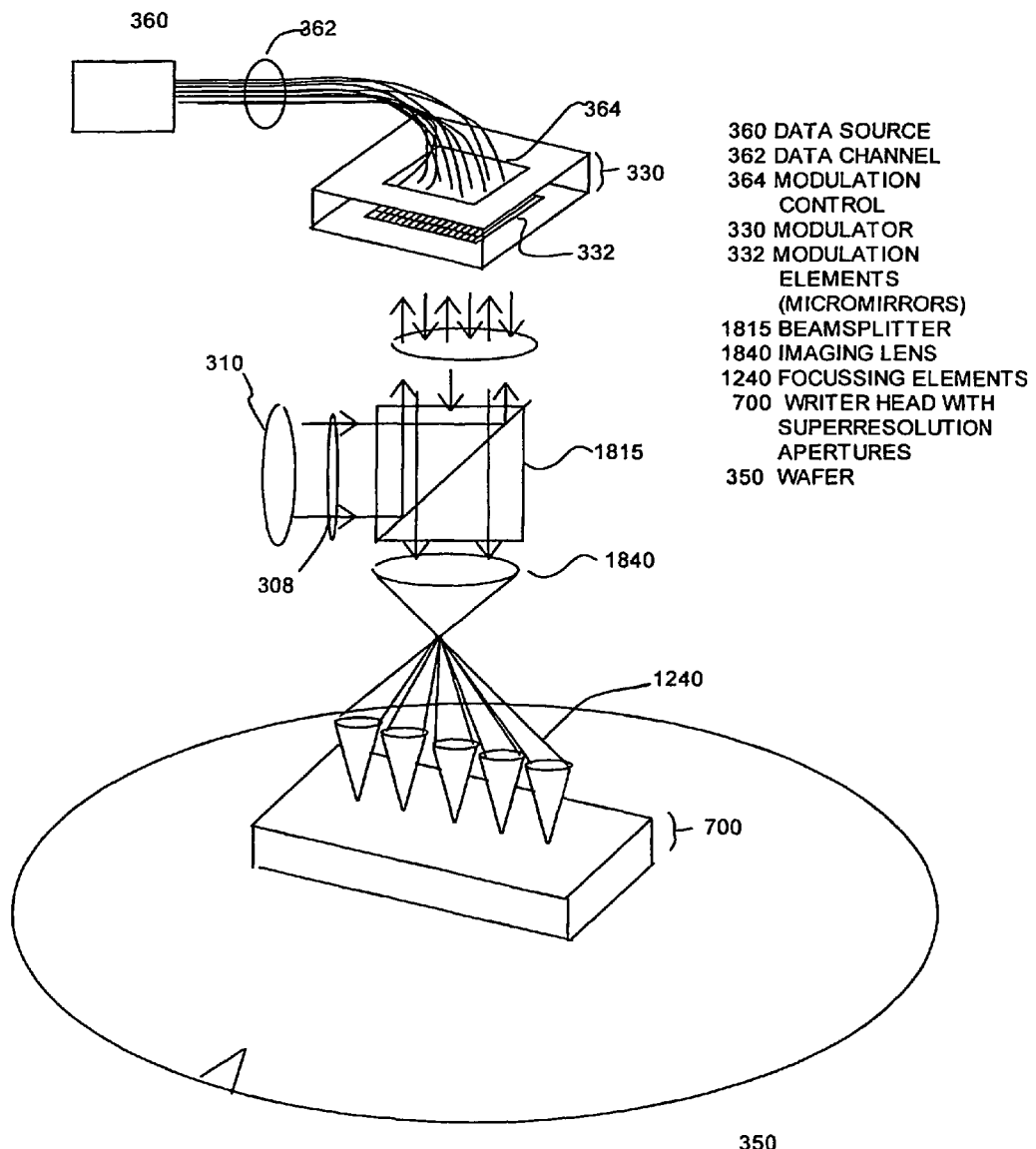

FIG. 18 shows an embodiment of the invention in which the modulation is provided by an array of micromirrors.

DETAILED DESCRIPTION AND PREFERRED EMBODIMENT

Writer Head.

Super-resolution systems are not in and of themselves new. Sub-wavelength apertures have been designed for several applications, notably near field scanning optical microscopy (NSOM) and optical recording. However, a particular sub-resolution aperture, often called a C-aperture, has been demonstrated to have extraordinary super-resolution properties, and has particular properties that can be useful for lithography.

Figure 4:
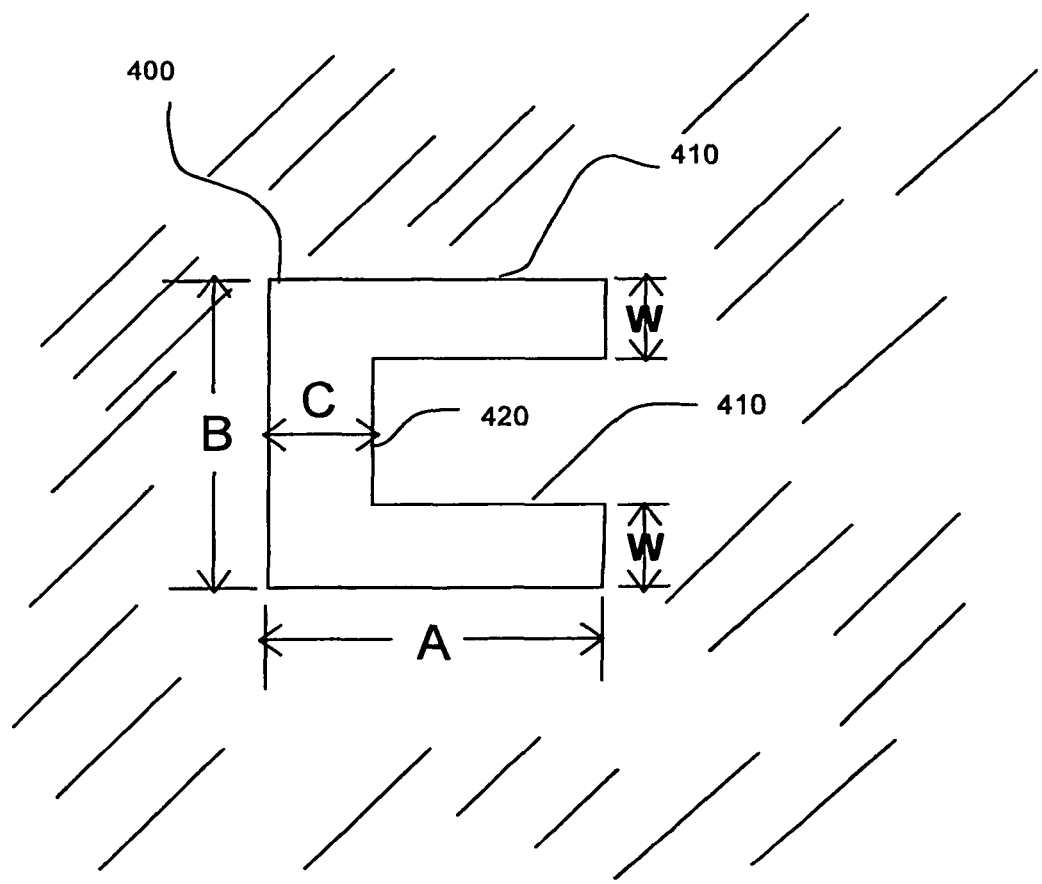
FIG. 4 shows a prior art C-aperture.

FIG. 4 shows a C-aperture 400. These have been described previously in publications from the Hesselink group at Stanford University, and U.S. patent application Ser. Nos. 10/877,220 and 10/845,781. A "typical" C-aperture has two arms 410 and a connecting back 420. The dimensions for arm length A, back height B, arm width W and back width C for the C-aperture plotted in FIG. 4 for use at $\lambda$=1000 nm are: A=220 nm, B=300 nm, and W=100 nm and C=100 nm. Dimensions can be proportionately scaled for use with other wavelengths, i.e. for $\lambda$=193 nm, A=42.5 nm, B=57.9 nm, W=C=19.3 nm.

The super-resolution spots from a C-aperture can be as small as $\lambda$/10. But, when compared to a square aperture of similar open area, the C-aperture has been demonstrated to have a transmission that is orders of magnitude greater. This is generally believed to be related to the electrical excitation of currents in the material around the arms of the aperture. The electrical conductivity of the material around the aperture is therefore a factor in the performance. For some materials and apertures, a resonance formed by surface plasmon can occur, enhancing the properties of the aperture. For other configurations, non-plasmonic resonances have been observed. The spots formed are therefore not only super-resolution, i.e. small, but also extraordinarily bright. Brightness improvements of $10^3$ to $10^6$ have been observed for C-apertures under certain circumstances. Although several definitions of a super-resolution aperture with extraordinary transmission can be used, we will consider a super-resolution aperture with extraordinary transmission to be one in which the transmission is at least a factor of 2 larger when compared with either a square aperture of the same area, or a circular aperture of the same area.

Figure 5:
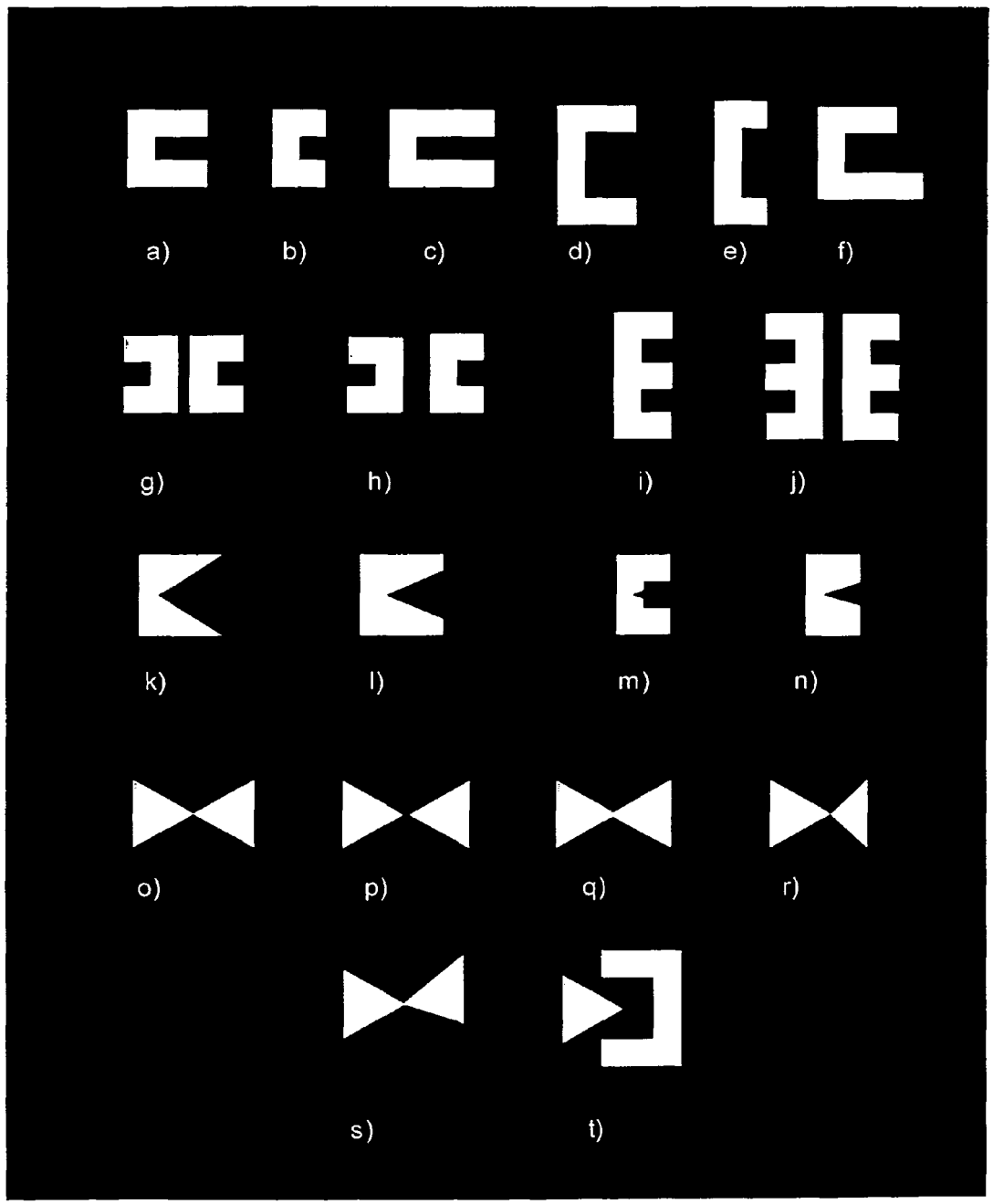
FIG. 5 shows a number of geometric shapes for apertures which have been demonstrated to have super-resolution capabilities.

The geometry and proportions of the aperture are also a factor, but some tolerance is allowed. The C-apertures need not maintain these exact dimensions or proportions. The widths of the arms need not be equal, and they need not equal the width of the back. The arms can be longer or shorter than the back, as shown in FIG. 5. For some cases, a bowtie aperture, also shown in FIG. 5, has been shown to have similar super-resolution capabilities. Again, the two sides of the bowtie may touch, or may be separated by a small amount of opaque material, and need not be symmetric or perfectly aligned to still function as a super-resolution aperture. Apertures with other structures may also be discovered which have extraordinarily high transmissivity. In general, although the previously described C-apertures may have certain beneficial super-resolution properties, the invention can be practiced with a number of super-resolution aperture designs that may become apparent to those skilled in the art, as long as the transmission through the aperture is a factor of 2 or larger than either a comparable square or circular aperture having the same opening area.

A nanowriter with a writing architecture using a single C-aperture can be formed using a configuration similar to a near-field scanning optical microscope (NSOM). Demonstrations of nanowriters using NSOM systems have been made, although none are known to have used a C-aperture. Such a system could be created by taking a fiber optic element, coating the end with a suitable conducting material, such as aluminum, silver, or gold, using a sputtering system or other deposition method, and then using a tool such as a programmable focused ion beam (FIB) system to selectively mill away material near the transmitting core of the fiber, leaving a C-aperture shaped opening. Another method of creating a C-aperture on the fiber tip is to further coat the end with a photoresist or an electron beam (E-beam) resist, and then expose the resist to a suitable dose of photons or E-beams in the shape of a C-aperture, followed by processing the resist to clear resist in the shape of the aperture and then etching the underlying conducting material so revealed.

The final step is the removal of the remaining resist once the etching has occurred. Other means to pattern the coated tip of the fiber will be known to those skilled in the art.

This can produce a fiber which has both a super-resolution spot and high relative transmission. However, writing the volume of data required for an IC with a single writing head would be extremely time consuming.

As an example, assume there are 6 contact holes for a single transistor in a layout. For a contemporary design with 100 million transistors, the number of contact holes would be 600 million. If exposure of a spot in photoresist requires a typical exposure dose-to-clear of 50 mJ/cm$^2$ (typical for Novalak resists used with $\lambda$=365 nm), a single 32 nm diameter contact can be written using 1 µW of transmitted power in 0.4 µsec. Addressing all contacts serially will therefore consume 240 sec in exposure time alone. Beyond this, additional time is required for stage motion between contact exposures. Assuming at least 250 IC fields per wafer, this gives a wafer processing rate less than 0.059 wafers/hr. This is clearly impractical, when competing technologies currently process wafers for 65 nm and 45 nm generation ICs at rates near 100 wafers/hr—over 1,500× faster.

Increasing the power from 1 µW to 1 mW could potentially reduce the writing time, but will still not achieve the goal. Furthermore, this does not consider the additional time required to move and then accurately position the writing element for exposing each spot. Larger IC designs requiring more contact holes would take proportionately more time.

Parallel writing approaches are therefore the only way wafers can be practically exposed. One architecture for parallel writing involves writing several wafers simultaneously using a single data stream, each with a single write head. However, mechanical management of the silicon wafers (currently 300 mm in diameter) and the requirement that many wafers be written identically limits the flexibility of such an approach. Also, the number of wafers processed per hour only increases by the number of wafers processed in parallel. More than 17 wafers would need to be simultaneously mounted in the above example to achieve an average rate of 1 wafer/hr, and any given wafer would still require an inordinately long write time.

Another approach to parallel writing involves configuring several writing apertures in an array on an integrated print head, to write several spots simultaneously. The layout data can be prepared to provide several data streams, one for each aperture. One possible architecture for a super-resolution aperture print head for use in high throughput nanolithography is shown in FIG. 6. Here, a linear or 1-D array of super-resolution apertures is formed in a suitable material, coated on a support structure. Spacing S in one direction is set so that neighboring apertures have a significant degree of overlap as the head is moved orthogonal to that direction (indicated by an arrow in the figure) while they are spaced much farther apart in the other direction (by a dimension P in the figure) These apertures can be formed by the same techniques outlined above for the single fiber case, e.g. FIB or E-beam exposure among others. In this illustration, although the motion of the aperture would be parallel to the line of the array, each aperture is slightly offset in position from the next, such that, as the wafer is moved beneath the array, individual spots at slightly different locations can be written by selectively turning on and off the appropriate aperture. Fine motion of the wafer is therefore not necessary, and the wafer can be moved using a uniform motion. For best results, the exposure characteristics must be carefully synchronized with the stage motion to insure accurate spot placement.

The support structure can be any mechanically strong material capable of supporting a film that is also transparent to the wavelength to be used. Quartz and sapphire are possible candidates, but other materials known to be transparent to UV and VUV can be used as well.

An optical source at the exposing wavelength is divided into a parallel number of channels, each corresponding to one aperture. Although individual sources can be used, such as an array of Vertical Cavity Surface Emitting Lasers (VCSELs) for each channel, dividing a single source allows power fluctuations to be normalized for all apertures, decreasing susceptibility to random dose variations.

To write individual pixels, each channel is individually modulated to expose the wafer in accordance with the pattern data provided in the microdevice layout. There are also one or more location sensors, to align and orient the printing head with reference to locations on the wafer. There are also one or more stabilization sensors combined with a control system to maintain the array a particular distance from the surface being exposed.

The extraordinary transmission of super-resolution apertures such as the C-aperture is related to the electrical conductance and optical properties of the material used to form the aperture. Traditionally, materials such as silver or gold have been used to demonstrate these phenomena using wavelengths such as $\lambda=1$ μm, for which both these metals are clearly conductors (optical properties n=0.272, k=7.07 for Au, where n and k are the real and imaginary components of the optical index of refraction). To achieve similar effects with $\lambda=365$ nm, $\lambda=248$ nm, or $\lambda=193$ nm (lithography wavelengths for which conventional materials and processes exist), the material coating in which the aperture exists must also be suitably conducting, i.e. have a large k value and small n values. Some possible candidate materials are shown below in Table I. It should be noted that, for $\lambda=193$ nm, silicon may be particularly attractive, partly because of its conducting properties, but also for the well developed ability to machine and process the material.

TABLE I

Optical properties for some metals.

|  |  | 1000 nm | 365 nm | 248 nm | 193 nm |
|---|---|---|---|---|---|
| Aluminum (Al) | n | 1.35 | 0.407 | 0.190 | 0.115 |
|  | k | 9.58 | 4.43 | 2.94 | 2.24 |
| Silver (Ag) | n | 0.226 | 0.186 | 1.298 | 1.02 |
|  | k | 6.99 | 1.61 | 1.35 | 1.17 |
| Gold (Au) | n | 1.35 | 0.407 | 0.190 | 0.115 |
|  | k | 9.58 | 4.43 | 2.94 | 2.24 |
| Platinum (Pt) | n | 3.33 | 1.62 | 1.36 | 1.32 |
|  | k | 5.7 | 2.62 | 1.76 | 1.28 |
| Chromium (Cr) | n |  | 1.39 | 0.85 | 0.842 |
|  | k |  | 3.24 | 2.01 | 1.647 |
| Silicon (Si) | n | 4.0 | 6.522 | 1.57 | 0.89 |
|  | k | 0 | 2.70 | 3.565 | 2.80 |

Materials such as aluminum, silver and chromium, when exposed to air, tarnish by forming oxides or other compounds which may affect their conductivity. Optical properties for some oxides are shown in Table II. For this reason, any use of a reactive material to provide the super-resolution apertures should be encapsulated in a protective coating that prevents or retards these decay processes. Controlling the environment of the lithography system to eliminate oxygen or other reactive compounds from the air surrounding the printing head may also be used.

TABLE II

Optical properties for metal oxides.

|  |  | 1000 nm | 365 nm | 248 nm | 193 nm |
|---|---|---|---|---|---|
| Silicon Dioxide ($SiO_2$) | n | 1.45 | 1.475 | 1.508 | 1.56 |
|  | k | 0 | 0 | 0 | 0 |
| $CrO_3$ | n |  |  |  | 1.636 |
|  | k | 0 |  |  | 0.65 |
| $Cr_2O_3$ | n |  |  |  | 1.76 |
|  | k | 0 |  |  | 0.311 |

A super-resolution aperture head according to the invention is shown in FIG. 7. FIG. 7a shows a 3-D view of the writing head, while FIG. 7b shows a cross section view. Here, light beams 702 each illuminate a structure plate 700, comprising a support material 710 coated below with a light blocking material 720. The light beams may be relayed from a micromirror configuration such as that illustrated in FIG. 18, or may be individually modulated by other means. In the coating of light blocking material, the super-resolution apertures 750 are formed. The interface between the air and the light blocking material may be coated in turn with a protective coating 730, to reduce the effects of tarnish, oxidation or other degradation possibilities.

To write many spots simultaneously, an array of apertures in the conducting film is needed. FIG. 6 shows a possible linear, one-dimensional array. Two-dimensional arrays of super-resolution apertures can also be used, illustrated in FIG. 8. However, arrays of super-resolution apertures in conducting materials have been known to produce extraordinary transmission arising from surface plasmons, and create bright regions with photons where none are desired. To mitigate this effect, as illustrated in FIG. 9, an arrayed head of C-apertures may have a non-conducting channel or channels 990 formed between apertures. Other techniques can also be applied to insulate them from each other and ensure a lack of crosstalk.

Referring again to FIG. 8, if the desired distance between exposure spots is distance S, and the spacing allowed between apertures is P, then the number of apertures N required for only a 1-D portion of the array to write an arbitrary spot on a 10 nm design grid is N=P/S. For example, if P=2 μm, and spots must be written with a center location specified to within 10 nm, S=10 nm and N=2000/10=200 apertures for a 1-D array. This is illustrated in FIG. 8. For 5 nm spot placement, an aperture array with N=400 would be required.

Coverage of larger areas can be achieved either by scanning a single head with, for example, 1×200 apertures over multiple stripe locations on the wafer, as shown in FIG. 10, or by adding additional apertures to form a two-dimensional array and scanning the two-dimensional array. It is expected that data conversion algorithms will be simplest for a square array, for example with 400×400=160,000 channels. With 160,000 channels, each causing wafer exposure using 1 μW, exposure of an entire wafer would now require only 0.375 sec, or a rate of 9,600 wafers/hr. In practice, this means that the wafer throughput is now limited by the ability to drive the head to the required locations, not the serial data limitations of the write head. However, since this corresponds to an illumination intensity of 1 μW/($10^{-6} \times 10^{-6}$ $cm^2$)=1 $MW/cm^2$, power density would be an issue to also be considered for optical damage from the illumination of the write head. 1 $MW/cm^2$ even for a short time will damage many materials, particularly absorbing materials.

We have assumed a square print head configuration for this example, but other rectangular designs or other head configurations may be found to have practical mechanical properties when used for a head moving at high speeds in close proximity to a wafer.

The above example assumed 2 μm spacing between exposure elements. Using a smaller center-to-center spacing would reduce the number of required channels, but require more passes of the head over the wafer to provide coverage of the same area. Similarly, a design grid requiring spot placement at arbitrary location on a grid smaller than 10 nm would indicate that more channels are required. This is assuming that the head is scanned over the wafer in a uniform manner, such as a raster scan. This is usually desired, since the mechanical motions of the scan and their associated accelerations and stresses can be quite regular and predictable and therefore the mechanical design becomes easier. It is conceivable that head designs that can tolerate the rapid accelerations of arbitrary spot addressing can also be created, making a more arbitrary pattern of motion possible for exposure.

Illumination Methods.

Illumination of the aperture must be provided. The light for each channel can be provided in a number of ways. One possible mechanism is to use an individual waveguide 1162 for each channel, such as a fiber optic waveguide. An array of several waveguides is illustrated in FIG. 11. For this embodiment, it is likely that points where light enters the waveguides would be separate and distinct, so that the light entering each waveguide could be easily modulated.

Another configuration, which might prove advantageous for mechanical design of the head, is to convey light from modulators to the apertures using free space propagation. This is shown in FIG. 12. In this example, a lens system 1240 would collect the light from each modulator 1232 and image it on the region of the aperture. Although this imaging system would be limited by diffraction, the spots themselves would be defined by the apertures, not the imaged spot size.

Figure 1:
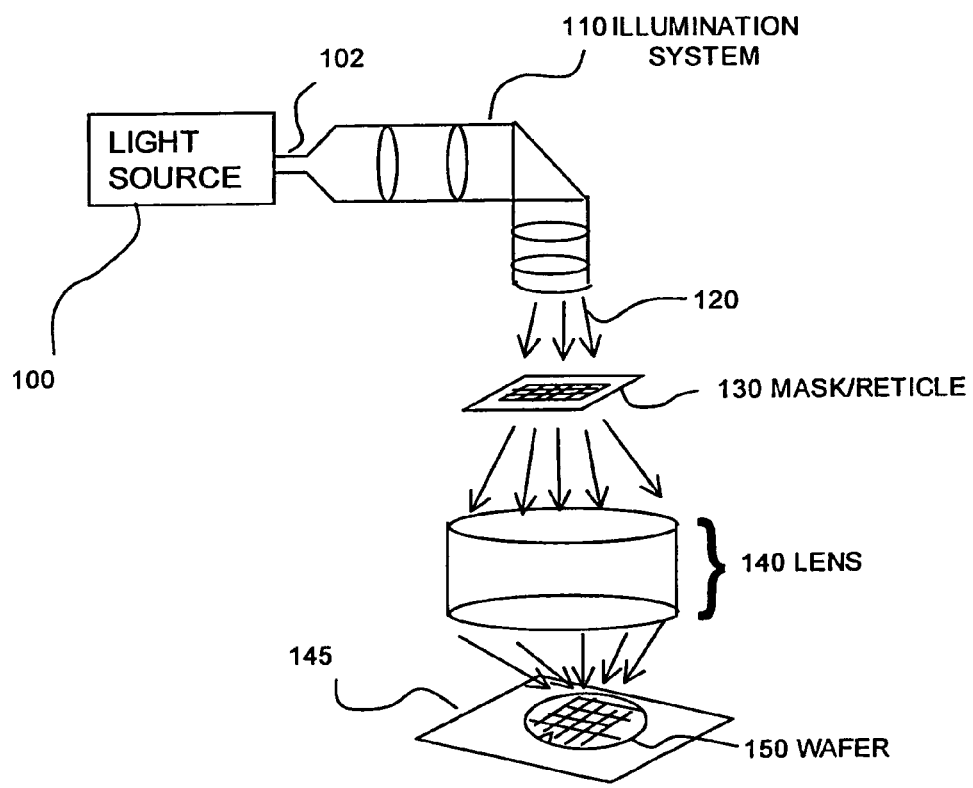
FIG. 1 shows an illustration of a typical configuration for a prior art projection lithography system.
Figure 2:
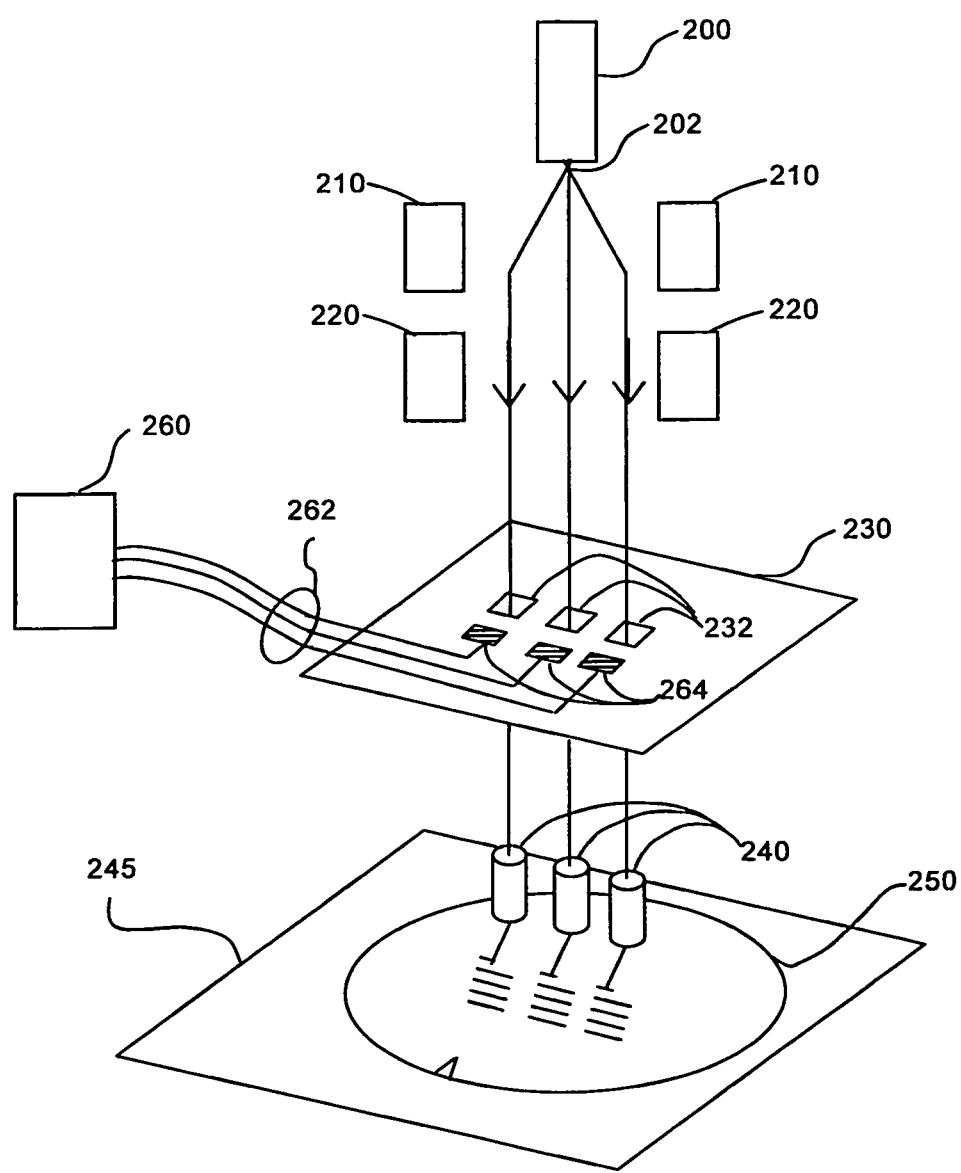
FIG. 2 shows an illustration of a prior art maskless lithography system using parallel electron beams.
Figure 3:
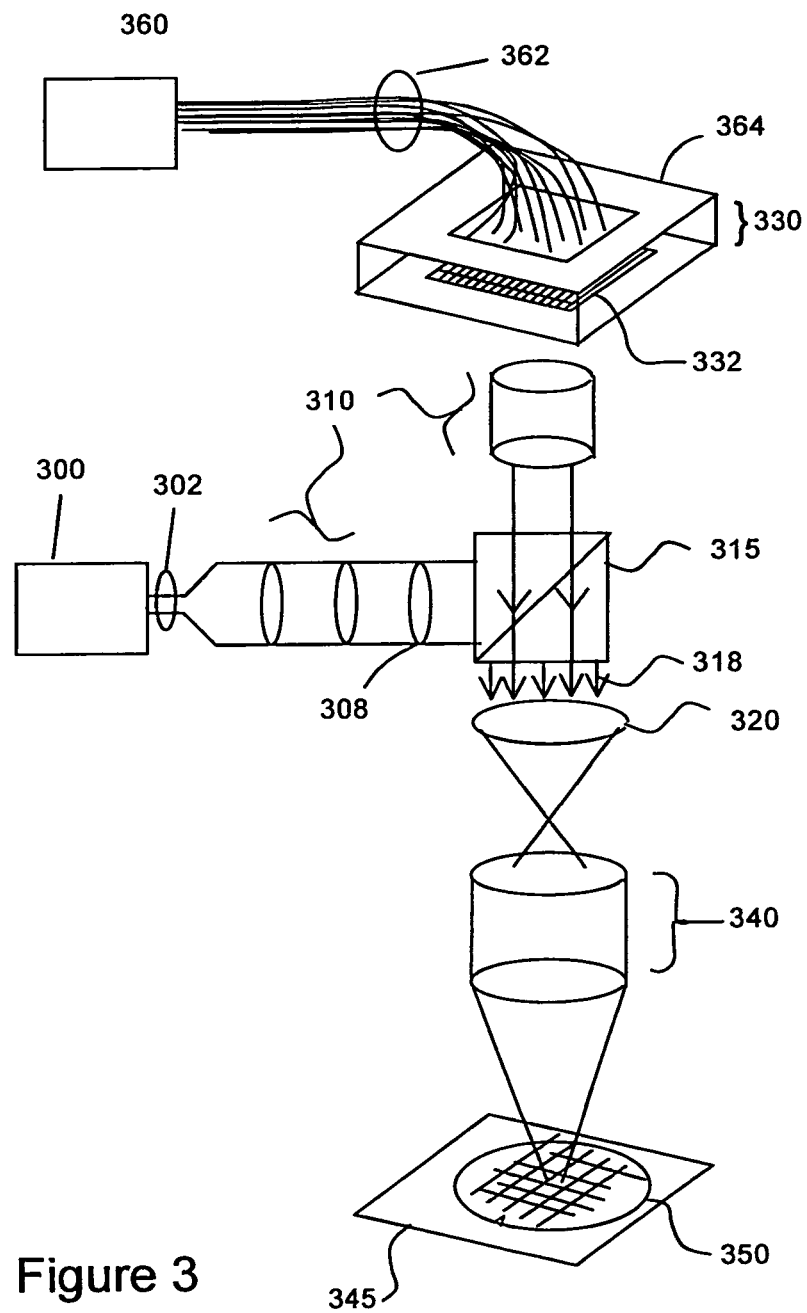
FIG. 3 shows an illustration of a prior art maskless lithography system using a mask of micromirrors and that exposes wafers using optical lithography.

The modulator 1232 in this case can be a modulator in transmission, such as one made of thin film transistors or liquid crystal light values, or one designed to be used in reflection, such as the micromirror array developed for the maskless approach described previously and illustrated in FIG. 3. The only requirement is that the modulator be able to modulate at speeds appropriate for the exposure required to be synchronized with the motion of the wafer stage.

The light source itself can be any coherent or partially coherent source of photons, as long as the total fluence of the source is enough that each individual channel has enough to expose a spot in the time allowed. For a system of 160,000 channels of 50 nW incident on each aperture, and where each aperture passes 5% of the total incident light, the average total source power would need to be at least 160 mW—a power level available using commercial CW argon ion lasers at 365 nm. Similar sources for 248 nm or 193 nm exposures may require additional investigation.

Thermal Effects.

No matter the final configuration, light which does not pass through the apertures must be accommodated. This may be either reflected back into the optical system, or partially absorbed by the material forming the C-aperture. In either case, it is possible that the light not used for exposure ends up providing local (and uneven) heating to some part of the head, affecting the mechanical properties and possibly the physical dimensions of the aperture through thermal expansion. Some method of heat mitigation may therefore be required in the design of the system to anticipate and compensate for these possible thermal effects. This may be the provision that an active cooling system, such as a thermoelectric cooler, be provided in contact with the writing head, that microchannels for cooling fluid be created in the head as it is fabricated, and/or cooling fluids, such as helium or another gas, or water or another fluid, be flowed over the head.

Data Channel.

IC layout data is normally in a hierarchical format such as GDS-II or OASIS, and to write a mask or wafer, it must be converted into a pattern of on/off signals to drive the modulator. This data conversion process is typically called fracturing. There are several data fracturing approaches that are currently available already. Furthermore, special data compression algorithms to provide data to 1000×1000 pixel spatial light modulators used in optical maskless systems using micromirrors have been developed by Zakhor et al. These approaches can be adapted to the system disclosed here, with the only requirement that the data be synchronized with the position sensors to ensure that the photon modulation appears on the wafer at the exact time the aperture is over the spot to be exposed. Consideration of the speed of light through a waveguide delivery system, for example, may be required for precise exposure of 32 nm spots.

Height Control.

The distance from the aperture to surface must be controlled to provide consistent, predictable spot sizes. Contemporary systems can control the distance between mechanical objects to a few tens of nanometers, with tolerances of 1 nm or even less. Well designed scanning probe microscopes can control these distances on an atomic scale. Each aperture configuration must be carefully designed and the distance controlled such that the shape of the exposed region having an iso-dose contour from the C-aperture spot matches the shape of the exposure, such as a contact hole, to be created. If a head with an array of spots is used that extends over a significant area, the wafer must be locally planar to the same degree over this area. Although this is commonly achieved using chemical-mechanical polishing (CMP), local topographic variations from different materials with different polishing characteristics, and also due to long range wafer bowing may occur as the head travels long distances over the wafer. The head therefore may require active flexing to allow the surface of the head to conform to the local plane of the wafer.

Sensors can therefore be provided to measure the distance to the wafer, and provide a control signal to an active servo loop that adjusts the position of the head. There are a number of conventional sensors that can be applied to this situation. In one possible configuration, a number of atomic force microscope (AFM) tips 1370 are provided at certain locations around the head, as shown in FIG. 13. In one embodiment of the invention, each AFM tip is controlled individually, each with its own feedback system for height control. The head would be controlled such that the AFM distances are held constant as the head moves over the wafer.

In another embodiment of the system, as illustrated in FIG. 14, the sensors are interferometers 1470, and infer the distance to the wafer using an interferometric fringe. This has an advantage in that the risk of crashing into the wafer is smaller than with an AFM tip, since the AFM tip is extremely close to the wafer. It can also have certain speed advantages. However, isolation between the optical path for exposure and for position sensing must be provided, which may make the optical fabrication of the head intricate and expensive. Furthermore, the optical reflection from the wafer may be complicated by multiple reflections from the multiple layers that have already been fabricated under the layer being exposed. Care must be taken in the interferometric design to ensure an accurate control signal in the presence of these possible additional reflections.

The head itself may also be designed to function without active control, but instead be aerodynamically designed to "fly" over the wafer surface at a constant height, with that height governed by the air flow over the head. Commonly used for magnetic recording in which the head flies within a few nm of the recording surface, a similar configuration to fly a head with at least one super-resolution aperture is incorporated in one embodiment of the invention.

A configuration involving 160,000 spots would, however, require a special design not found in conventional magnetic recording heads. In magnetic discs, the head velocity is maintained by spinning the recording surface below the head. For an optical recording system and a rotating wafer, the on/off control for the modulator must be precisely timed with the rotation to allow a spot of specific dimensions to be written. Synchronization of the modulation with signals from detectors that sense relative head position and relative velocity can allow placement and dimensional control. This is provided by having a sensor system that detects wafer position, a data processing system that processes the IC layout data, and a synchronization system which determines the correct exposure timing signals needed to modulate the exposure system to deliver the correct dose to the correct location. With multiple spots in an array, the precise position and speed for each spot must be determined, to provide the correct on/off behavior to write the features as desired. Since spots at different distances from the center of rotation will move at different linear speeds, a preferred embodiment will have a configuration such as that shown in FIG. 15, in which each spot is maintained at a precise distance from the center of rotation.

Data fracturing for a circular writing plan must also be considered. Normal fracturing algorithms for maskless systems pixelate the layout and provide it to an array of micromirrors. Data are provided as tiles, at a rate synchronized with the laser pulses. Synchronization of modulation for individual features with variable wafer speed is not necessary. However, with the wafer now moving at various linear speeds, depending on the distance from the center of rotation, the individual head modulations depend on the local wafer speed. A data fracturing system which decomposes the layout modulation signals into tracks, to be written in synchronization with the position and velocity feedback signals from the wafer, as illustrated in FIG. 16 can improve the writing performance considerably.

Such a fracturing system, as with conventional fracturing systems, will typically be implemented using a computer system, comprising data processing circuitry, data storage devices such as disk drives, random access memory circuitry, input and output devices, and a communications network or data bus system to facilitate data transfer between these components.

Light Source.

The light source for exposure would ideally be a single mode, continuous wave (CW) laser that would be split or focused into multiple beams, one for each modulator channel. The power in each channel would nominally be identical, although individual control and calibration may be required for the channels as fabricated. The power from the source can be monitored and coordinated with the wafer position information and the modulator control to ensure that the exposure for each desired spot is correct, even if the laser power itself fluctuates. Alternatively, the power can be controlled to a fixed, constant value very accurately with a conventional "noise eater" that delivers uniform power to the modulators, eliminating the need for complicated controls on each channel, but losing some power at the noise eater to ensure stability.

Modulations as described in the examples here would be at speeds on the order of 10 MHz. This is easily achievable using many modulation schemes. Alternatively, the laser itself can be operated in a pulsed mode, either using a pulsed source or in a mode-locked configuration. In this case, the intensity switches on and off in intense, highly repetitive short pulses with a small duty factor (e.g. 10 ns pulses at 2 kHz). Such a system would allow the system modulators to act as blanking systems, opening in synchrony with the pulses and allowing a certain number of pulses through to provide the correct dose. This may present advantages in modulator design, allowing some jitter in the modulator channel itself, since on/off behavior is actually dictated by the laser pulses, which can be quite uniform.

Additionally, another embodiment of the invention, illustrated in FIG. 17, comprises an additional light source 1700, which can have a wavelength different than the wavelength being used for exposure (e.g. a red diode laser light source at $\lambda=680$ nm compared to an exposure wavelength of $\lambda=365$ nm.) In a configuration where the red light and exposure light are combined with a beamsplitter 1712, both will pass through the optical system and fall on the sub-resolution aperture. Some light of each wavelength will pass through the aperture.

Since most lithography materials are insensitive to light with wavelengths longer than 400 nm, exposure with red light will not cause additional lithographic reactions. Instead, some light will be reflected off the surface of the material being exposed, and will be reflected back through the aperture. A beamsplitter that separates the two different wavelengths directs the shorter wavelength light to a detector or sensor. Signal processing circuitry can be used to infer from the shorter wavelength signal the distance between the aperture and the wafer, as in the previous interferometer configuration of FIG. 14. It can also be used to infer the amount of exposure received, by, for example, detecting the change in the wavefront as the refractive index of the exposed material changes with exposure.

While specific materials, designs, aperture configurations and fabrication steps have been set forth to describe this invention and its preferred embodiments, such descriptions are not intended to be limiting. Modifications and changes may be apparent to those skilled in the art, and it is intended that this invention be limited only by the scope of the appended claims.

We claim:

1. A method for performing nanolithography using multiple exposures, comprising:
    exposing features larger than a predetermined dimension using a conventional optical lithography system; and
    exposing features smaller than a predetermined dimension using an optical exposure system comprising at least one super-resolution aperture.

2. The method of claim 1,
    in which the multiple exposure steps are carried out on the same semiconductor wafer.

3. The method of claim 2,
    in which the semiconductor wafer is coated with a photoresist prior to exposure;
    and in which the photoresist is developed after the multiple exposure steps.

4. The method of claim 1,
    in which the at least one super-resolution aperture is a bow-tie shaped aperture.

5. The method of claim 1,
    in which the at least one super-resolution aperture is a C-aperture.

6. The method of claim 1,
in which the predetermined dimension is 40 nanometers.

7. A method for performing nanolithography using multiple exposures, comprising:
applying photoresist to an object to be patterned;
exposing the photoresist using a conventional optical lithography system for certain designated features;
exposing the photoresist using an optical exposure system comprising at least one super-resolution aperture for features smaller than a predetermined dimension; and
developing the photoresist.

8. A method for performing nanolithography using multiple exposures, comprising:
applying photoresist to an object to be patterned;
exposing the photoresist using a conventional lithography system for certain designated features;
exposing the photoresist using an optical exposure system comprising at least one super-resolution aperture in a predetermined exposure pattern; and
developing the photoresist.

9. A method for performing lithography, comprising:
coating an object to be patterned with a photosensitive material;
determining at least one location on the object to be patterned by photoexposure;
aligning an optical exposure system comprising at least one super-resolution aperture to the at least one location; and
exposing the photosensitive material at the at least one location on the object to photons transmitted through the at least one super-resolution aperture.

10. The method of claim 9, further comprising:
developing the exposed photoresist;
etching the portion of the object revealed by development; and
removing the remaining resist.

11. The method of claim 9, in which
the at least one super-resolution aperture is a C-aperture.

12. The method of claim 9, in which
the at least one super-resolution aperture is a bow-tie aperture.

13. The method of claim 9, in which
the step of aligning the optical exposure system comprises:
alignment using predetermined alignment marks.

14. The method of claim 9, in which
the step of aligning the optical exposure system comprises:
alignment with predetermined tracks on the object to be patterned.

15. The method of claim 9, in which
the step of aligning the optical exposure system comprises:
placing the super-resolution aperture in close proximity to the object to be exposed, such that the illumination pattern from the aperture is a near-field exposure pattern.

16. The method of claim 9, additionally comprising:
determining a second exposure location on the object to be patterned;
aligning the optical exposure system with a second exposure location; and
exposing the second exposure location to photons transmitted through the at least one super-resolution aperture.

17. The method of claim 9, in which
the optical exposure system comprises a plurality of super-resolution apertures;
and comprising:
determining a plurality of exposure locations on the object to be patterned;
aligning the optical exposure system with at least one of the exposure locations;
moving the optical exposure system along the object to be patterned; and
modulating the intensity of photons from each of the super-resolution apertures as the optical exposure system is moved.

18. The method of claim 17, further comprising:
moving the optical exposure system along the object to be patterned; and
modulating the intensity of photons from each of the super-resolution apertures as the optical exposure system is moved more than once, such that
the final exposure dose in the photosensitive material at a predetermined location has been provided by more than one super-resolution aperture.

* * * * *